(12) United States Patent
Johnson et al.

(10) Patent No.: US 8,453,181 B1
(45) Date of Patent: May 28, 2013

(54) METHOD AND APPARATUS FOR PERFORMING A CHANNEL SEARCH IN A TELEVISION

(75) Inventors: Gene Harlow Johnson, Carmel, IN (US); Matthew Thomas Mayer, Indianapolis, IN (US); Scott Edward Klopfenstein, Fishers, IN (US); Aaron Hal Dinwiddie, Cicero, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 1774 days.

(21) Appl. No.: 10/031,091

(22) PCT Filed: Jun. 23, 2000

(86) PCT No.: PCT/US00/17374
§ 371 (c)(1),
(2), (4) Date: Jan. 15, 2002

(87) PCT Pub. No.: WO01/06771
PCT Pub. Date: Jan. 25, 2001

Related U.S. Application Data

(60) Provisional application No. 60/144,654, filed on Jul. 16, 1999.

(51) Int. Cl.
*H04N 5/445* (2011.01)
(52) U.S. Cl.
USPC ............ 725/59; 725/80; 725/131; 725/139; 725/151; 348/731
(58) Field of Classification Search
USPC ........... 725/53, 59, 80, 131, 139, 151, 48–50; 348/553, 733, 706, 705
See application file for complete search history.

(56) References Cited

U.S. PATENT DOCUMENTS

| | | | |
|---|---|---|---|
| 5,103,314 A | 4/1992 | Keenan | |
| 5,161,023 A | 11/1992 | Keenan | |
| 5,448,370 A * | 9/1995 | Kim et al. | 386/83 |
| 5,629,733 A | 5/1997 | Youman et al. | 348/7 |

(Continued)

FOREIGN PATENT DOCUMENTS

| | | |
|---|---|---|
| JP | 4-282978 | 10/1992 |
| JP | 05/014824 | 1/1993 |

(Continued)

*Primary Examiner* — Kristine Kincaid
*Assistant Examiner* — Sumaiya A Chowdhury
(74) *Attorney, Agent, or Firm* — Robert D. Shedd; Kuniyuki Akiyama

(57) ABSTRACT

A television, such as an HDTV receiver, includes a plurality of signal inputs each of which is adapted to receive television signals comprising a plurality of channels and communicate the received television signals to a processor/tuner for selection of the various channels by a user for viewing on a display of the television. A channel search routine for the detection of channels in the television signal is accomplished on the currently designated signal input rather than on all signal inputs of the television. The channels detected during the search of the currently designated signal input are included in a channel list that is stored in memory of the television. A GUI is preferably used to initiate the channel search and is capable of displaying the detected channels relating to the currently selected signal input. Channel lists for each signal input are updated as the channels are detected. A complete channel list may be maintained for all signal inputs as well as individual channel lists for each signal input.

4 Claims, 1 Drawing Sheet

U.S. PATENT DOCUMENTS

| | | | |
|---|---|---|---|
| 5,727,060 A | 3/1998 | Young | 380/10 |
| 6,003,041 A * | 12/1999 | Wugofski | 707/104.1 |
| 6,137,546 A * | 10/2000 | Shintani et al. | 348/731 |
| 6,243,645 B1 | 6/2001 | Moteki et al. | |
| 6,359,580 B1 * | 3/2002 | Morrison | 348/731 |

FOREIGN PATENT DOCUMENTS

| | | | |
|---|---|---|---|
| JP | 05014824 A | | 1/1993 |
| JP | 6-022231 | | 1/1994 |
| JP | 05/252459 | | 9/1998 |
| JP | 05252459 A | | 9/1998 |
| KR | 1999/002935 | | 1/1999 |
| WO | 9820303 A1 | | 5/1998 |
| WO | 99/16247 | | 4/1999 |
| WO | WO 99/16247 | * | 4/1999 |
| WO | 99/35833 | | 7/1999 |
| WO | WO 99/35833 | * | 7/1999 |

* cited by examiner

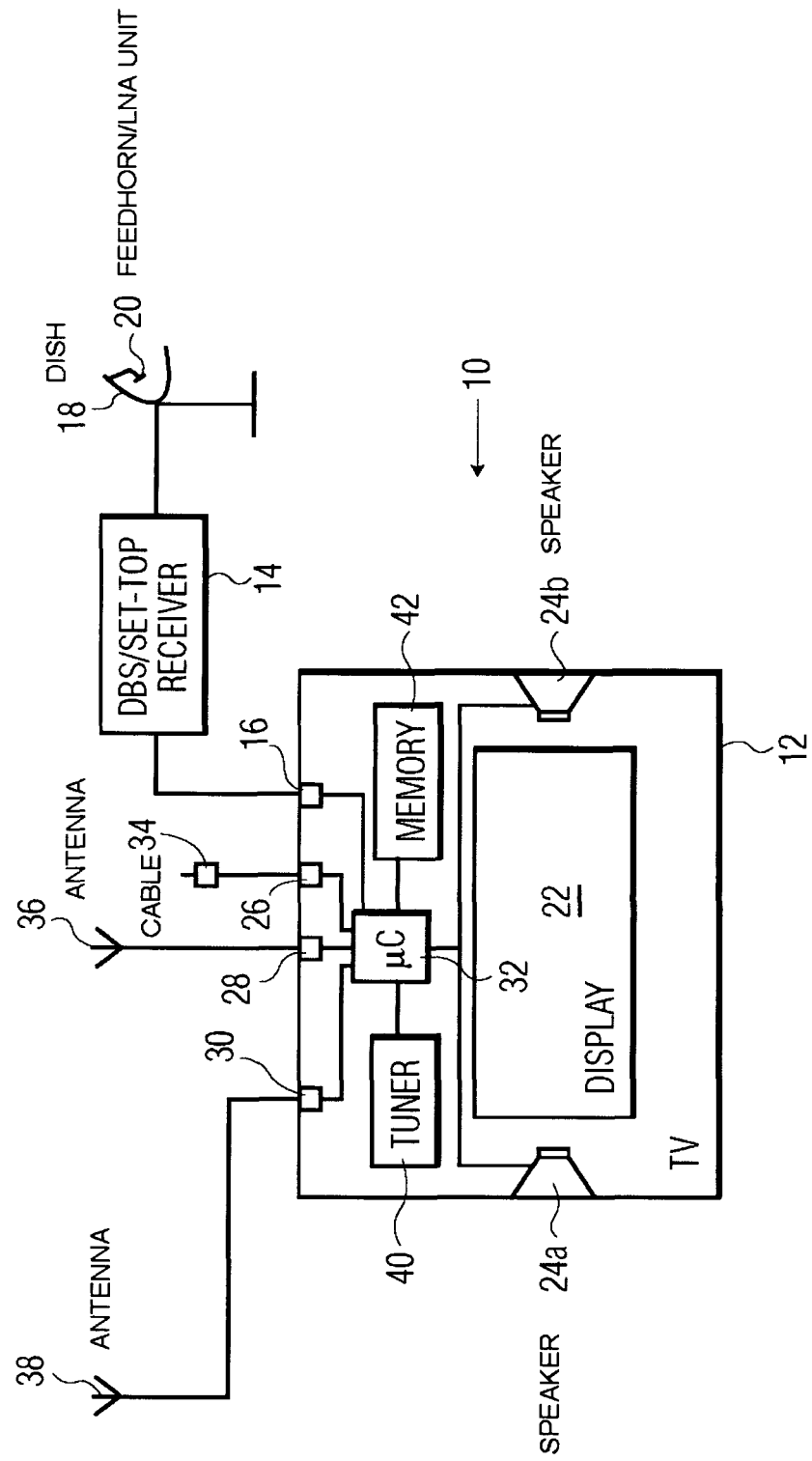

METHOD AND APPARATUS FOR PERFORMING A CHANNEL SEARCH IN A TELEVISION

CROSS-REFERENCE TO RELATED APPLICATIONS

This application claims the benefit under 35 U.S.C. §365 of International Application PCT/US00/17374, filed Jun. 23, 2000, which was published in accordance with PCT Article 21(2) on Jan. 25, 2001 in English; and which claims benefit of U.S. provisional application Ser. No. 60/144,654 filed Jul. 16, 1999.

BACKGROUND OF THE INVENTION

1. Field of the Invention

The present invention relates to digital television signals and, more particularly, to the search and detection of digital HDTV television signals.

2. Description of the Related Art

High Definition television (HDTV) sets and other digital equipment such as set-top boxes must be able to receive digital and analog television signals from various sources. In order to accomplish this, such television receivers and other digital/analog equipment have two or more signal inputs that are adapted to receive various television signal sources. The television allows the user to switch between the various signal inputs in order to view the channels carried by the signal source coupled to the selected signal input.

Digital and analog television signals may be received from sources such as antennas, community cable systems, Direct Broadcast Satellite (DBS) systems, or the like. These various signal sources are coupled to separate signal inputs of the television and/or other digital/analog equipment (hereinafter collectively termed "television"). Each signal source typically carries many television channels. Some of the channels from the various signal sources are the same while some of the channels are different. With regard to both analog and digital off-air television signals from an antenna, if several digital channels are available, the user may be required to manually adjust the antenna in order to receive the best possible reception from all available channels.

With any signal source, the television needs to know what channels are available for each signal source or signal input, in order to skip those channels that do not carry programming when the user is switching between the various channels. Channel autoprogramming algorithms and systems for automatically detecting active channels and indicating the active channels in a channel scanning list are known for analog television receivers.

It is known to provide a channel search routine for analog channels that will obtain a discrete sample or "snapshot" of all the currently available channels on all of the various signal inputs. The channel search routine then stores all of the channels detected from all of the signal inputs during the search in memory (e.g. EEPROM), deleting any channels previously stored that are not now currently available. At power-up of the unit, the channels in EEPROM become the channel list. This may occur when the user makes an adjustment to the antenna, such as moving position or location, or when the DBS or cable system adds and/or deletes channels.

Part of the channel search process is detecting if cable or an air antenna is connected to the signal input. This detection is performed on all signal inputs. Such a search may be an iterative process. The user potentially will need to adjust the antenna and complete a channel search several times before correctly positioning the antenna for superior reception of all channels available. As this is a time consuming process, there is a need for a different type of channel search.

It is thus an object of the present invention to provide a channel search that will shorten the time necessary to complete the channel acquisition process.

SUMMARY OF THE INVENTION

In accordance with one aspect of the present invention, there is provided a method and apparatus for performing a channel search on a television having multiple signal inputs.

In one form, a channel search is performed only on the currently selected signal input of the television rather than on all signal inputs. Depending on the number of signal inputs, channel search time is reduced by at least one-half the time.

According to an aspect of the present invention, since the channel search is performed on only the currently selected signal input, there is no need to perform a cable/antenna detection algorithm. This as well reduces the amount of time necessary to perform the channel search.

According to another aspect of the present invention, the present channel search may use information that was found during a last full channel search or information that was entered by the user.

In another form, a channel search program/routine preferably of a graphical user interface (GUI) e.g., a television programming or set-up menu, is adapted to allow the user to accomplish a channel search on only the currently selected signal input and/or enter information regarding the existence of various channels. The GUI can be combined with other GUI functions of a similar nature, i.e. channel information, rather than to have the user navigate through several menu options.

BRIEF DESCRIPTION OF THE DRAWING

The above-mentioned and other features and advantages of this invention, and the manner of attaining them, will become more apparent and the invention will be better understood by reference to the following description of an embodiment of the invention taken in conjunction with the accompanying drawing, wherein:

FIG. 1 depicts a multimedia system adapted to receive and utilize digital and analog television signals, as well as perform various television channel searches and storage of channel lists for various inputs.

Corresponding reference characters indicate corresponding parts throughout the several views. The exemplification set out herein illustrates a preferred embodiment of the invention, and such exemplification is not to be construed as limiting the scope of the invention in any manner.

DETAILED DESCRIPTION OF THE INVENTION

Referring now to the drawings and, more particularly to FIG. 1, there is shown a simplified, functional block diagram of a multimedia system 10. Multimedia system 10 may include television ("TV") or monitor 12 and DBS and/or set-top box receiver 14. DBS receiver 14 is in communication with signal input 16 of TV 12 via a communication line as is known in the art. DBS (Direct Broadcast System) receiver 14 is in communication with dish (or antenna) 18 via a communication line as is also known in the art. Dish 18 receives digital multimedia and/or data signals, e.g. television, music and/or internet signals (hereinafter collectively "television signals"), that are focused onto and received by feedhorn/

LNA (Low Noise Amplifier) unit 20. Feedhorn/LNA unit 20 typically receives and slightly amplifies the received television signals and transmits the amplified television signals to DBS receiver 14 for processing.

TV 12 includes image display or viewing area 22 and speakers 24a and 24b. In addition to signal input 16, TV 12 also includes signal inputs 26, 28, and 30. Signal inputs 16, 26, 28, and 30 are typically RF type signal inputs but may be any type of signal input such as RF and S-video. Additionally, while TV 12 is shown with four signal inputs, it should be understood that the number of signal inputs may vary from two to as many as practical. As depicted in FIG. 1, signal input 26 is signified as coupled with a CATV or cable system via cable or communication input line 34. TV 12 is shown coupled to antenna or aerial 36 via a communication input line with signal input 28. Likewise, antenna or aerial 38 is coupled to TV 12 via a communication input line. Antennas 36 and 38 are designed to receive off-air or terrestrially broadcast television signals which may be either digital or analog television signals. As such, antennas 36 and 38 are generally adjustable either manually or automatically. While antennas 36 and 38 are shown coupled to signal inputs 28 and 30 respectively, signal input 26 is shown coupled to CATV, and signal input 16 is shown coupled to DBS 14, it should be understood that generally each signal input can accept any input device, i.e. antenna, CATV, DBS or the like. Thus what is shown in FIG. 1 is for illustrative purposes only.

Signal inputs 16, 26, 28 and 30 are fed into microcontroller unit ("µC") 32 such that television signals from any signal input may be selected for discriminating or tuning the various channels and receiving any data signals by tuner or selector 40 as is known in the art. Tuner 40 is in communication with µC unit 32 such that analog and digital television signals received from either antenna 36 or 38, CATV 34, or dish 18 are received and processed by µC unit 32 as is known in the art. In addition to other functions as are known in the art, µC unit 32 provides control and/or implementation of the various software programs/routines and is in communication with various components in accordance with the various aspects of the present invention, such as memory 42, e.g. EEPROM, RAM, ROM, display 22, and speakers 24a and 24b for providing audio output for the user.

Additionally, µC unit 32 includes the ability to generate, process, and display OSD information/data on display 22. The OSD information/data may be part of a received television signal or may be generated internally. Such OSD information may include channel number, time, signal strength, on-screen electronic program guides (EPGs), internet data, pop-up windows, on-screen electronic programming menus, and the like. Microcontroller unit 32 also runs various software necessary to process and/or utilize the incoming digital signals as is known in the art and additionally as provided herein.

It should be understood that µC unit 32 by itself or along with tuner 40 and memory 42 form a module capable of implementing the present invention. This module may be totally separate (discrete module) or may incorporate existing constituents of the various components (virtual module). In this manner, the module may be incorporated into TV 12, DBS/Set-Top Receiver Unit 14, or any other digital component capable of receiving and/or utilizing digital television signals.

As is typical of televisions, TV 12 is able to process only television signals from one signal input or signal reception medium, i.e. antenna, cable or satellite dish. The choice of which signal input to process and thus the channels to watch is determined by the user typically through input from a remote (not shown) as is known in the art. Thus, the selection of which signal input 16, 26, 28 or 30 to have TV 12 process and allow the various channels to be viewed on display 22 is chosen by the user.

In accordance with the present invention, upon initiation of a channel search in order to detect what channels are being broadcast in the television signal, the channel search routine tries to detect channels only from the currently selected signal input of signal inputs 16, 26, 28, and 30. Upon detection of a channel on which information is being broadcasted, a channel list stored in memory 42 is updated to include the detected channel for the particular signal input. The channel search may utilize channel information that was determined during a last channel search for the particular signal input. Alternatively or additionally, the channel search may utilize channel information that was entered by the user. The channel list preferably includes a label or identifier for each active channel detected which relates the detected channel to the particular signal input being scanned. Thus, when a user is viewing channels from a selected signal input, only those channels that were detected from the selected signal input are displayable.

In order to further reduce the time necessary to perform channel detection, the various signal inputs 16, 26, 28, and 30 may accept only certain signal sources. For example, signal input 16 may only accept DBS/Set-top box type television signals and thus only those channels that are typical of DBS/Set-top box signals. Signal inputs 28 and 30 may accept only terrestrial or off-air television signals (VHF/UHF) that only carry characteristics channels, while signal input 26 may accept only cable television signals which carry only a certain range of channels. Preferably, television 12 includes a full channel search routine that detects all available channels from all signal inputs 16, 26, 28, and 30, in order to establish a baseline channel list if necessary.

It is not necessary for television 12 to perform a channel search/scan on television signals from every signal input. As such, the present invention preferably performs the channel detection/search/scan only on those signal inputs that are coupled to antennas that are receiving off-air or terrestrial television signals, and those signal inputs that are coupled to CATV systems for receiving cable TV signals. At a minimum, the present invention may be applied only to those signal inputs that are coupled to antennas. In FIG. 1, this would be signal inputs 28 and 30 which are coupled to antennas 36 and 38 respectively, and signal input 26 which is coupled to a CATV system. It should be understood that while a DBS receiver 14 is shown coupled to television 12 via signal input 16, the present channel search is not performed on this set of television signals, since the DBS receiver 14 performs this function. This would also be true of a VCR or like device (not shown) that would be coupled to a signal input. Generally, the present channel search is performed on the signal inputs coupled to the antennas. As such this would eliminate a cable/air detection routine as performed in the prior art thereby reducing the time necessary to perform the channel search function.

Upon selection of a channel scan by the user, preferably from within a screen of a GUI, a channel search is started on the channels characteristic of the signal input. A next frequency starting from a chosen frequency is scanned for detection of a usable signal. If there is not a next frequency, the routine is done. When a next frequency is encountered, it is determined whether there is a usable signal on the frequency/channel. Usable may be determined by applying a threshold signal strength for the incoming signal to overcome or other parameter or set of parameters. For each incoming frequency/ channel that does not meet threshold signal strength requirements or otherwise, the channel may be removed from the channel list and a next frequency is determined. A continuous non-receipt of usable channels results in a loop until there are no more next frequencies available. For each incoming frequency/channel that does meet threshold signal strength requirements or otherwise, the channel is added to the channel list, preferably with an identifier indicating which signal input it is from. The process repeats until there is no next frequency.

While this invention has been described as having a preferred design, the present invention can be further modified within the spirit and scope of this disclosure. This application is therefore intended to cover any variations, uses, of adaptations of the invention using its general principles. Further, this application is intended to cover such departures from the present disclosure as come within known or customary practice in the art to which this invention pertains and which fall within the limits of the appended claims.

What is claimed is:

1. In a video processing apparatus having at least two video inputs, each video input able to receive a video signal originating from a respective one of a plurality of different external input sources including cable and antenna video signal sources and coupled to a display device, a method of performing a channel search comprising:
   utilizing information generated from a previous full channel search regarding whether a previously selected video input is coupled to one of said cable and antenna video signal sources in order to skip one of cable and air channel detection routines that has been performed in conjunction with said previously selected video input;
   selecting manually on a screen of a GUI by a user a video input as a currently selected video input exclusively from one of said at least two video inputs, wherein said at least two video inputs are receiving different video signals from respective ones of said plurality of different external input sources;
   determining by said video processing apparatus if said video signal received on said currently selected video input is at least one of a certain type of video signal and said video signal received on said currently selected video input originates from a certain type of video source;
   detecting available channels from various possible channels received from the video source connected to only said currently selected video input when said received video signal is at least one of said certain type of video signal and originates from said certain type of video source; and
   updating a channel list of all channels available for said currently selected video input.

2. The method of claim 1, wherein detecting available channels comprises detecting only digital channels.

3. A video processing apparatus coupled to a display device and having at least two RF video inputs, each RF video input able to receive a video signal originating from a respective one of a plurality of different external input sources including cable and antenna video signal sources and being coupled to a respective source of television signals, the video processing apparatus comprising:
   means for utilizing information generated from a previous full channel search regarding whether a previously selected video input is coupled to one of said cable and antenna video signal sources in order to skip one of cable and air channel detection routines that has been performed in conjunction with said previously selected video input;
   means for exclusively selecting one RF video input from the at least two RF video inputs as a currently selected RF video input of a television signal source for processing in response to a request made by a user, wherein said at least two RF video inputs are receiving different video signals from said different external input sources;
   means for providing a GUI on which said user may manually make said request;
   means for determining by said video processing apparatus if said video signal received on said currently selected RF video input is at least one of a certain type of video signal and said video signal received on said currently selected RF video input originates from a certain type of video source;
   means for detecting available channels received from the video source connected to only said currently selected RF video input selected by said means for selecting when said received video signal is at least one of said certain type of video signal and originates from said certain type of video source; and
   means for updating a channel list of all channels available for said selected RF video input.

4. The video processing apparatus of claim 3, wherein the means for detecting available channels comprises detecting only digital channels.

* * * * *